(12) United States Patent
Baum et al.

(10) Patent No.: US 10,392,700 B2
(45) Date of Patent: Aug. 27, 2019

(54) SOLID VAPORIZER

(71) Applicant: ENTEGRIS, INC., Billerica, MA (US)

(72) Inventors: Thomas H. Baum, New Fairfield, CT (US); Robert L. Wright, Jr., Newtown, CT (US); Bryan C. Hendrix, Danbury, CT (US); Scott L. Battle, Cedar Park, TX (US); John M. Cleary, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 335 days.

(21) Appl. No.: 15/525,796

(22) PCT Filed: Mar. 28, 2015

(86) PCT No.: PCT/US2015/023215
§ 371 (c)(1),
(2) Date: May 10, 2017

(87) PCT Pub. No.: WO2015/164029
PCT Pub. Date: Oct. 29, 2015

(65) Prior Publication Data
US 2017/0342557 A1  Nov. 30, 2017

Related U.S. Application Data

(60) Provisional application No. 61/982,325, filed on Apr. 21, 2014.

(51) Int. Cl.
*C23C 16/448* (2006.01)
*C23C 16/18* (2006.01)

(52) U.S. Cl.
CPC ...... *C23C 16/4483* (2013.01); *C23C 16/4481* (2013.01); *C23C 16/18* (2013.01)

(58) Field of Classification Search
CPC .. C23C 16/18; C23C 16/4481; C23C 16/4483
See application file for complete search history.

(56) References Cited

U.S. PATENT DOCUMENTS

| 4,190,965 A | * | 3/1980 | Erickson | A23L 3/40 |
| | | | | 219/400 |
| 4,916,828 A | | 4/1990 | Yamane et al. | |
| 5,221,354 A | * | 6/1993 | Rigney | C23C 10/06 |
| | | | | 118/715 |
| 6,270,839 B1 | * | 8/2001 | Onoe | C23C 16/4481 |
| | | | | 118/726 |

(Continued)

OTHER PUBLICATIONS

International Search Report and Written Opinion for International Application No. PCT/US2015/023215, dated Jun. 25, 2015 (15 pages).

*Primary Examiner* — William M McCalister
(74) *Attorney, Agent, or Firm* — Entegris, Inc.

(57) ABSTRACT

Vaporizers are described, suited for vaporizing a vaporizable solid source materials to form vapor for subsequent use, e.g., a deposition of metal from organometallic source material vapor on a substrate for manufacture of integrated circuitry, LEDs, photovoltaic panels, and the like. Methods are described of fabricating such vaporizers, including methods of reconfiguring up-flow vaporizers for down-flow operation to accommodate higher flow rate solid delivery of source material vapor in applications requiring same.

15 Claims, 5 Drawing Sheets

(56) References Cited

U.S. PATENT DOCUMENTS

| | | | | |
|---|---|---|---|---|
| 7,300,038 B2* | 11/2007 | Gregg | | C23C 16/4481 |
| | | | | 118/726 |
| 7,708,835 B2* | 5/2010 | Suzuki | | C23C 16/4481 |
| | | | | 118/726 |
| 7,967,911 B2* | 6/2011 | Carlson | | C23C 16/4482 |
| | | | | 118/723 VE |
| 8,821,640 B2* | 9/2014 | Cleary | | C23C 16/4402 |
| | | | | 118/726 |
| 9,034,105 B2* | 5/2015 | Chaubey | | C23C 16/4481 |
| | | | | 118/726 |
| 9,109,287 B2* | 8/2015 | Birtcher | | C23C 16/4481 |
| 2002/0009544 A1* | 1/2002 | McFeely | | C23C 16/16 |
| | | | | 427/248.1 |
| 2002/0078894 A1 | 6/2002 | Timmons et al. | | |
| 2003/0047141 A1* | 3/2003 | Warnes | | C23C 16/4488 |
| | | | | 118/726 |
| 2004/0016404 A1* | 1/2004 | Gregg | | C23C 16/4481 |
| | | | | 118/726 |
| 2005/0019026 A1 | 1/2005 | Wang et al. | | |
| 2006/0024439 A2* | 2/2006 | Tuominen | | C23C 16/405 |
| | | | | 427/248.1 |
| 2006/0112882 A1* | 6/2006 | Suzuki | | C23C 16/16 |
| | | | | 118/726 |
| 2006/0219168 A1* | 10/2006 | Brcka | | C23C 16/16 |
| | | | | 118/715 |
| 2007/0170604 A1* | 7/2007 | Soininen | | C23C 16/4481 |
| | | | | 261/122.1 |
| 2008/0191153 A1* | 8/2008 | Marganski | | B01J 7/00 |
| | | | | 250/492.21 |
| 2008/0202426 A1* | 8/2008 | Suzuki | | C23C 16/4481 |
| | | | | 118/726 |
| 2012/0266967 A1* | 10/2012 | Kanjolia | | C23C 16/4481 |
| | | | | 137/1 |
| 2013/0105483 A1* | 5/2013 | Carlson | | C30B 23/00 |
| | | | | 220/367.1 |

\* cited by examiner

SOLID VAPORIZER

CROSS-REFERENCE TO RELATED APPLICATIONS

This application claims priority to and the benefit of International Application No. PCT/US2015/023215, filed Mar. 28, 2015, and titled "SOLID VAPORIZER", which in turn claims priority from and the benefit of US Provisional Application having Ser. No. 61/982,325, filed on Apr. 21, 2014, both of which are incorporated herein by reference in their entireties.

FIELD

The present disclosure relates to vaporizers useful in volatilizing solid precursors to provide precursor vapor to a precursor vapor-utilizing process system such as a vapor deposition chamber or an ion implanter for manufacturing of semiconductor products, flat-panel displays, solar panels, etc.

DESCRIPTION OF THE RELATED ART

In the use of solid-phase precursors to supply precursor vapor for vapor-utilizing applications, a wide variety of vaporizers has come into use. Such vaporizers may comprise a vessel and cover defining an enclosed interior volume in which a solid phase precursor may be stored and subsequently subjected to volatilization conditions to effect sublimation or vaporization of the solid phase precursor to produce precursor vapor.

For such purpose, the vessel may be fabricated of a heat-conductive material, and heated to cause the volatilization of the precursor and/or a heated carrier gas may be flowed through the vessel to create a mass transfer gradient resulting in entrainment of precursor vapor from the solid source precursor material.

A wide variety of vaporizers has been developed, and efforts are continuing to evolve new designs that maximize the efficiency of solid precursor volatilization, that are compact, resist clogging incident to precursor vapor condensation and re-solidification, minimize energy input that is necessary to dispense a given quantity of precursor vapor, and that otherwise afford advantages over existing vaporizers.

In the current state of the art, there is a need for high-flow, small-volume solid delivery vaporizers. Controlled solid delivery of dopant materials, such as TMI (trimethylindium) and $Cp_2Mg$ (bis cyclopentadienyl magnesium), is critical for next-generation MOCVD tools comprised of multi-chamber automated tools. These tools are required for increasing device yields while simultaneously lowering the cost-of-ownership. One method for achieving uniform delivery of the dopants is to use high gas-flows (1-5 SLM) of carrier gas though solid delivery ampoules. Unfortunately, these high flows can also lead to channeling through solid precursors and a loss of uniform precursor delivery over time. Vaporizers designed for low carrier gas flows (50-500 sccm) can achieve uniform solid precursor delivery, but are inadequate to satisfy the process requirements for gas supply.

A related problem in the use of solids such as TMI and $Cp_2Mg$ for MOCVD formation of LED films is the requirement of using such precursors at room temperature or below, at high carrier gas flow rate and higher overall reactor pressure, in order to assure repeatability, reproducibility, and maintenance of high yields. In these applications, vaporizers designed for low carrier gas flows may dispense unsaturated streams at significant flow rates, e.g., at 500 sccm and higher, when operated at room temperature and at elevated temperatures, and when operating at pressures on the order of 500-900 Torr. Since OEM tool makers will seek to operate future tools at these processing conditions, improvements in vaporizers are needed to achieve saturation of the carrier gas at lower temperature and flow rates of 1-2 SLM and above.

SUMMARY

The present disclosure relates to vaporizers and methods of making and using the same.

In one aspect, the disclosure relates to a vaporizer, comprising:
a vessel defining an interior volume and containing in the interior volume an assembly of trays configured to support vaporizable solid source material and in spaced-apart relationship to one another;
an inlet adapted to introduce carrier gas to an upper portion of the interior volume of the vessel, above the assembly of trays, for flow of the carrier gas downwardly in contact with the vaporizable solid source material supported by the trays, to form carrier gas/solid source vapor mixture in a lower portion of the interior volume; and
a gas flow passage member adapted to flow carrier gas/solid source vapor mixture from the lower portion of the interior volume of the vessel, to an outlet of the vessel for discharge therefrom.

In another aspect, the disclosure relates to a vaporizer, comprising:
a vessel defining an interior volume and containing in the interior volume an assembly of trays configured to support vaporizable solid source material and in spaced-apart relationship to one another;
an inlet adapted to introduce carrier gas to the interior volume of the vessel for flow of the carrier gas through the interior volume in contact with the vaporizable solid source material supported by the trays, to form carrier gas/solid source vapor mixture;
an outlet for discharging from the vessel a carrier gas/solid source vapor mixture formed by contacting of the carrier gas with the vaporizable solid source material supported by the trays; and
the assembly of trays comprising trays with flow passages for flow of the carrier gas therethrough, wherein the flow passages comprise one or more of:
(i) tubular passages of internal diameter of up to ¼ inch (0.635 cm), e.g., in a range of from ⅛ inch (0.3175 cm) to ¼ inch (0.635 cm);
(ii) arched slits in the trays; and
(iii) porous frit material.

In another embodiment, the disclosure relates to a vaporizer, comprising:
a vessel defining an interior volume and containing in the interior volume an assembly of trays configured to support vaporizable solid source material and in spaced-apart relationship to one another;
an inlet adapted to introduce carrier gas to the interior volume of the vessel for flow of the carrier gas through the interior volume in contact with the vaporizable solid source material supported by the trays, to form carrier gas/solid source vapor mixture;
an outlet for discharging from the vessel a carrier gas/solid source vapor mixture formed by contacting of the carrier gas with the vaporizable solid source material supported by the trays; and an array of support rings in the interior volume of the vessel, wherein each support ring is positioned to support thereon one tray of said assembly of trays, in alternating sequence of support rings and trays to form a stacked array of alternating support rings and trays.

The disclosure relates in another aspect to a method of adapting a trayed vaporizer configured for flow of carrier gas from a lower portion of an interior volume of the vaporizer to an upper portion of the interior volume of the vaporizer for contact with vaporizable solid source material supported on trays in the vaporizer, so that the vaporizer is able to accommodate higher flow rate of carrier gas through the interior volume in delivery of vaporized solid source material from the vaporizer, wherein the vaporizer comprises an inlet and outlet for flowing carrier gas through the interior volume, such method comprising coupling the outlet with a supply of carrier gas, and coupling the inlet with a discharge passage for dispensing of carrier gas/vaporized solid source material mixture from the vaporizer, to thereby reconfigure the output as a carrier gas inlet, and the inlet as a carrier gas/vaporized solid source material mixture outlet.

A further aspect of the disclosure relates to a method of fabricating a vaporizer configured for flow of carrier gas through an interior volume of a vaporizer vessel for contact with vaporizable solid source material supported on trays in the vaporizer vessel to form a carrier gas/vaporized solid source gas mixture for discharge from the vaporizer, such method comprising providing multiple trays and support rings, and alternatingly installing the support rings and successive ones of the multiple trays in the interior volume of the vaporizer vessel, to form a stacked array of alternating support rings and trays, wherein each support ring is positioned to support thereon one of the multiple trays. In this method, the trays may comprise flow passages or porous materials, e.g., frits, for passage of the carrier gas therethrough. The trays may comprise one or more trays with arched openings arranged to disperse carrier gas in the interior volume of the vessel.

In a further aspect, the disclosure relates to a method of enhancing performance of a vaporizer configured for bottom-up flow of carrier gas through an interior volume of the vaporizer, from an inlet of the vaporizer to an outlet of the vaporizer, such method comprising reconfiguring the vaporizer so that carrier gas is flowed to the interior volume of the vaporizer from the outlet and discharged from the interior volume of the vaporizer through the inlet so that the vaporizer is reconfigured for top-down flow of carrier gas through the interior volume of the vaporizer.

Other aspects, features and embodiments of the disclosure will be more fully apparent from the ensuing description and appended claims.

DETAILED DESCRIPTION

Figure 1:
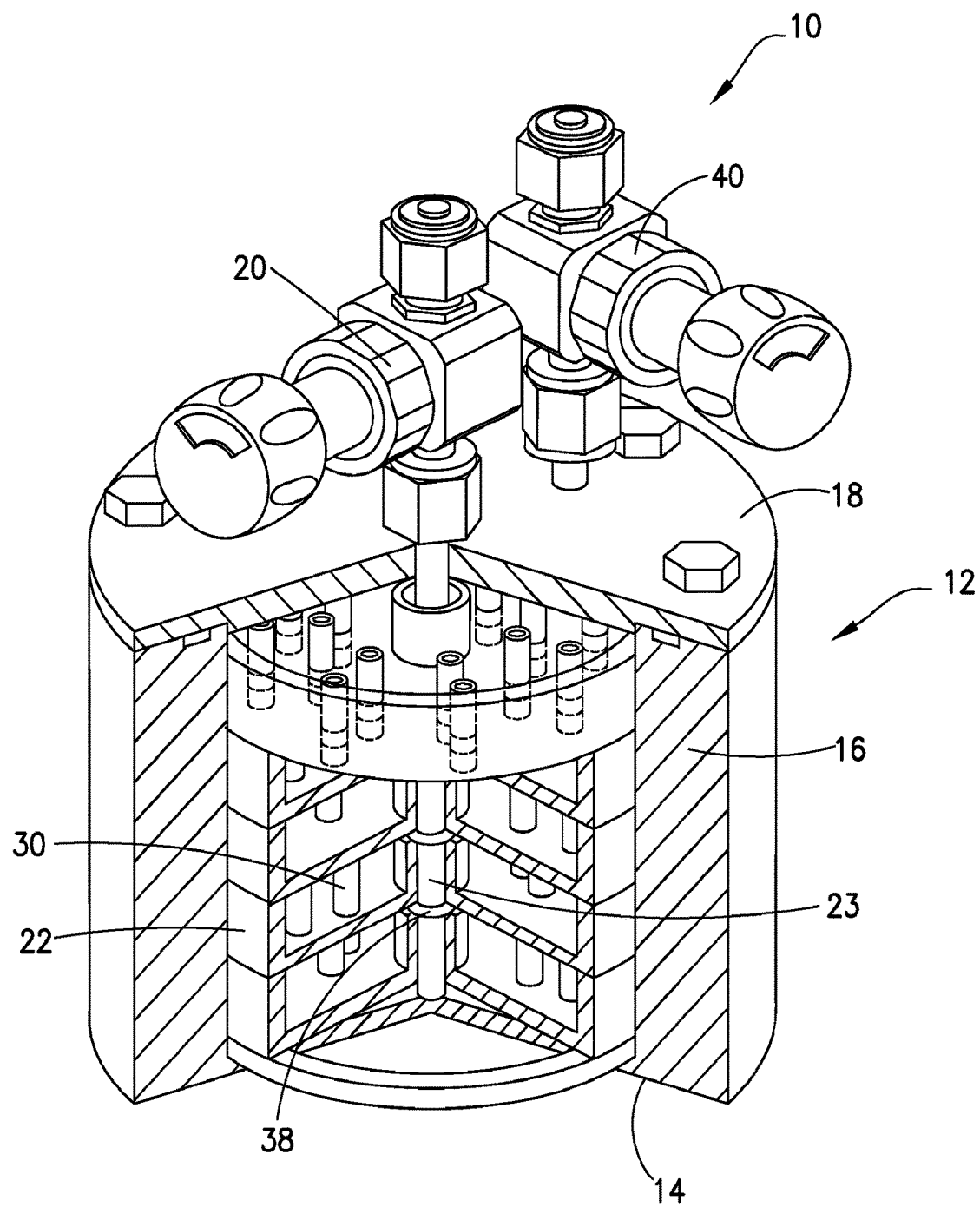
FIG. 1 is perspective view of a vaporizer of a general type susceptible to modification in accordance with the present disclosure.

The present disclosure relates to solid vaporizers and associated methods of fabrication and use.

In one aspect, the disclosure relates to a vaporizer, comprising:

a vessel defining an interior volume and containing in the interior volume an assembly of trays configured to support vaporizable solid source material and in spaced-apart relationship to one another;

an inlet adapted to introduce carrier gas to an upper portion of the interior volume of the vessel, above the assembly of trays, for flow of the carrier gas downwardly in contact with the vaporizable solid source material supported by the trays, to form carrier gas/solid source vapor mixture in a lower portion of the interior volume; and a gas flow passage member adapted to flow carrier gas/solid source vapor mixture from the lower portion of the interior volume of the vessel, to an outlet of the vessel for discharge therefrom.

The assembly of trays in such vaporizer may comprise trays with flow passages for flow of the carrier gas therethrough.

Such vaporizer may comprise a lid configured to mate with the vessel at an upper end of the vessel, wherein the gas flow passage member comprises a gas flow tube having an open lower end disposed in a lower portion of the vessel, and extending upwardly through the lid through an outlet opening therein. The assembly of trays as mentioned may comprise trays with flow passages for flow of the carrier gas therethrough. In specific embodiments, the flow passages may comprise arched slits in the trays. In various embodiments, the flow passages may define carrier gas flow passages of internal diameter in a range of from ⅛ inch to ¼ inch (0.3175 to 0.635 cm).

The above-described vaporizer may be configured in various embodiments, with the assembly of trays comprising an assembly of fritted disks.

Vaporizers of the foregoing embodiments may comprise a solid source material supported by at least some of the trays in the assembly of trays. For example, the solid source material may be supported on an upper surface of at least some trays in the assembly.

In other embodiments, vaporizers as described above may be coupled with a carrier gas source configured to supply carrier gas at volumetric flow rate of at least 1 standard liter per minute.

In another aspect, the disclosure relates to a vaporizer, comprising:

a vessel defining an interior volume and containing in the interior volume an assembly of trays configured to support vaporizable solid source material and in spaced-apart relationship to one another;

an inlet adapted to introduce carrier gas to the interior volume of the vessel for flow of the carrier gas through the interior volume in contact with the vaporizable solid source material supported by the trays, to form carrier gas/solid source vapor mixture;

an outlet for discharging from the vessel a carrier gas/solid source vapor mixture formed by contacting of the carrier gas with the vaporizable solid source material supported by the trays; and the assembly of trays comprising trays with flow passages for flow of the carrier gas therethrough, wherein the flow passages comprise one or more of:

(i) tubular passages of internal diameter in a range of from ⅛ inch to ¼ inch (0.3175 to 0.635 cm);

(ii) arched slits in the trays; and (iii) porous frit material.

In this vaporizer, the flow passages in various embodiments may comprise tubular passages of internal diameter in a range of from ⅛ inch to ¼ inch (0.3175 to 0.635 cm). In other embodiments, the flow passages may comprise arched slits in the trays. The vaporizer in any embodiments may comprise a solid source material supported by at least some of the trays in the assembly of trays, e.g., source material that is supported on an upper surface of said at least some trays.

In another embodiment, the disclosure relates to a vaporizer, comprising:

a vessel defining an interior volume and containing in the interior volume an assembly of trays configured to support vaporizable solid source material and in spaced-apart relationship to one another; an inlet adapted to introduce carrier gas to the interior volume of the vessel for flow of the carrier gas through the interior volume in contact with the vaporizable solid source material supported by the trays, to form carrier gas/solid source vapor mixture;

an outlet for discharging from the vessel a carrier gas/solid source vapor mixture formed by contacting of the carrier gas with the vaporizable solid source material supported by the trays; and an array of support rings in the interior volume of the vessel, wherein each support ring is positioned to support thereon one tray of said assembly of trays, in alternating sequence of support rings and trays to form a stacked array of alternating support rings and trays.

This vaporizer may be arranged with the support rings configured to support a peripheral portion of the tray supported thereon. In various embodiments, the support rings may be configured to be in contact with interior volume surface of the vessel. The support rings may be formed of any suitable material of construction, e.g., a metal, metal alloy, or other conductive material. The assembly of trays can comprises one or more trays with arched openings arranged to disperse carrier gas in the interior volume of the vessel.

The disclosure relates in another aspect to a method of adapting a trayed vaporizer configured for flow of carrier gas from a lower portion of an interior volume of the vaporizer to an upper portion of the interior volume of the vaporizer for contact with vaporizable solid source material supported on trays in the vaporizer, so that the vaporizer is able to accommodate higher flow rate of carrier gas through the interior volume in delivery of vaporized solid source material from the vaporizer, wherein the vaporizer comprises an inlet and outlet for flowing carrier gas through the interior volume, such method comprising coupling the outlet with a supply of carrier gas, and coupling the inlet with a discharge passage for dispensing of carrier gas/vaporized solid source material mixture from the vaporizer, to thereby reconfigure the output as a carrier gas inlet, and the inlet as a carrier gas/vaporized solid source material mixture outlet.

A further aspect of the disclosure relates to a method of fabricating a vaporizer configured for flow of carrier gas through an interior volume of a vaporizer vessel for contact with vaporizable solid source material supported on trays in the vaporizer vessel to form a carrier gas/vaporized solid source gas mixture for discharge from the vaporizer, such method comprising providing multiple trays and support rings, and alternatingly installing the support rings and successive ones of the multiple trays in the interior volume of the vaporizer vessel, to form a stacked array of alternating support rings and trays, wherein each support ring is positioned to support thereon one of the multiple trays. In this method, the trays may comprise flow passages or porous materials, e.g., frits, for passage of the carrier gas therethrough. The assembly of trays in various embodiments can comprise one or more trays with one or more arched openings arranged to disperse carrier gas in the interior volume of the vessel.

Such flow passages may comprise one or more of: (i) tubular passages of internal diameter in a range of from ⅛ inch to ¼ inch (0.3175 to 0.635 cm); (ii) arched slits in the trays; and (iii) porous media of varying porosities. The trays in such methodology may comprise fitted disks. In various embodiments, the trays prior to installation in the interior volume of the vaporizer vessel have advantageously been loaded with vaporizable solid source material, e.g., on and/or in such trays.

In embodiments, vaporizers of the present disclosure may be fabricated with frit disks as support elements for precursor in an interior volume of the vaporizer vessel. The frit disks may be formed of a sintered metal or other porous material having porosity that is appropriate to the specific precursor material being employed. For example, frit disks may be employed that have an outer diameter that is substantially equal to the inner diameter of the vaporizer vessel in which the frit disks are deployed, so that the frit disks are press-fitted to the interior surface of the vessel, or otherwise are in substantial contact with the inner wall surface of the vaporizer vessel, so that when the vaporizer vessel is heated, the frit disks conduct heat radially inwardly to heat the precursor supported on the disks. In a specific arrangement, the periphery of the frit disk may be formed with a scalloped or serpentine edge configuration, so as to provide contact with the crests of the scalloped or serpentine edge regions. Alternatively, the frit disks may be formed with a sawtooth configuration, for the same purpose, in which the protruding sawtooth elements contact the inner wall surface of the vaporizer vessel.

The frit disks in other embodiments may be configured with an edge that is in spaced relationship to the inner wall of the vaporizer vessel, to allow carrier gas flow around the edges of the disks during flow through the interior volume of the vessel from the inlet to the outlet.

The fit disks are advantageously formed with significant porosity to permit permeation of the carrier gas and precursor vapor therethrough. Frit disks having a porosity (pore volume, as a percentage of the overall bulk volume of the disk) in a range of from 25% to 75% may be usefully employed in some embodiments of the disclosure. In other embodiments, fit disks having a porosity in a range of from 45% to 60% are usefully employed. The frit disks can be used as trays to support precursor thereon, and frit disks can also be used as carrier gas diffuser plates to effect spreading of influent gas over the entire cross-section of the vaporizer vessel, and/or to provide a barrier element to entrainment loss of solid particles of the precursor in the dispensed gas mixture.

It will be apparent from the foregoing discussion that the pore size and porosity characteristics of frit disks may be widely varied in the broad practice of the present disclosure, with the specific dimensional characteristics being dependent on the carrier gas flow rates, character and size (if in a divided form) of the precursor supported on the frit disk, hydrodynamic character of the specific vaporizer configuration, etc., and specific pore size and porosity dimensional characteristics may be readily determined within the skill of the art, based on the present disclosure, to provide frit disks of appropriate character for a given precursor vapor delivery application.

It will also be appreciated that the frit disks above discussed may be employed in combination with trays and/or precursor support structures of other types, e.g., in combinations of frit disk(s) and tray(s), wherein the frit disk(s) serve in a gas distribution and/or solids barrier role and/or solids support role, with tray(s) serving to support solids and distribute gas, e.g., through flow passages therein.

It will be appreciated that vaporizers with any number of trays, frit disks, and/or other gas flow management and/or precursor support members or assemblies may be employed. For example, vaporizers with only a single tray or a single frit disk are contemplated within the broad scope of the present disclosure. Thus, the vaporizer may have one, two, three, four, five, six, or more trays, frit disks, and/or other internal structure members or assemblies adapted for installation or deployment in the interior volume of the vaporizer vessel.

While the disclosure herein is primarily directed to vaporizers in which precursor is used in a solid form, it will be appreciated that vaporizers of the present invention in various embodiments are usefully suited to vaporization of precursors in the form of high melting point liquids and/or liquids per se. Further, while the disclosure is primarily directed to vaporizers in which a carrier gas of suitable character is employed as a contacting medium for interaction with precursor and/or precursor vapor to produce a gas mixture including the carrier gas and precursor vapor, it will be appreciated that vaporizers are also contemplated in which sublimation of precursor is carried out to produce precursor vapor for discharge from the vessel, without any use of carrier gas, e.g., in which the vaporizer is configured as a sublimator, and does not have a carrier gas inlet, but rather only a precursor vapor outlet.

Further, the vaporizers of the present disclosure may be configured with a gas flow port or ports at any portion or portions of the vaporizer. For example, the vaporizer may have a gas flow outlet and/or a gas flow inlet that is on a top lid or cover of a vaporizer vessel, or alternatively on a side wall or bottom or floor of the vaporizer vessel. Where the vaporizer includes both inlet and outlet structures, such structures may be arranged in spaced-apart relationship to one another so that gas flow anomalies such as bypassing and short-circuiting do not occur in operation. A vaporizer may have multiple inlet and/or outlet structures, which may be manifolded or otherwise coupled with one another or otherwise arranged to achieve desired flow patterns and hydrodynamic efficiency of the vaporizer in operation.

Still further, while the disclosure herein includes a number of embodiments with a central downtube or uptube, depending on the direction of gas flow therethrough, it will be appreciated that tubes or conduits of such type may be positioned off-center or otherwise asymmetrically in relation to the vessel of the vaporizer. It will be appreciated that gas flow ingress to and egress from the vessel may be carried out in any of various structural implementations.

Filters may be utilized in vaporizers of the present disclosure, and such filters may be variously deployed to ensure a desired level of particulates in the gas streams flowed into, through, and out of the vaporizer vessel. Filters may be arranged at the inlet and/or outlet of the vaporizer vessel, in the appertaining inlet and/or outlet ports, or in associated gas flow conduits, or in fittings to which vessel structure is coupled. Filters may also be employed in the vessel, e.g., overlying a tray or frit disk to retain precursor in position on the supporting surface, or otherwise to strain solids out of the gases so that clogging or other undesired behavior is minimized or eliminated. Where trays or frit disks contain flow passages therethrough, such flow passages may also contain filter elements to prevent solids carryover by and in the gas.

Vaporizers of the present disclosure may be of any suitable type as regards the volatilization of the precursor. While vaporizers may be configured and arranged for heating of the vaporizer vessel and internal structure to transmit heat to the precursor for volatilization thereof, vaporizers may also be configured for volatilization of precursor under ambient temperature conditions, such as where the vaporizer is sealed and maintained under pressure, e.g., under an inert gas blanket at superatmospheric pressure, which subsequently is released when the vaporizer is coupled to flow circuitry for dispensing of precursor vapor. The release of such pressurizing gas, which serves to suppress volatilization of the precursor during vaporizer storage and transport, enables the precursor at a lower pressure to volatilize for dispensing of the precursor vapor.

The precursor itself may be of any suitable form for generation of precursor vapor in the interior volume of the vaporizer vessel. The precursor for example may be of a particulate, granular, powdered, or other divided character, or it may be provided in the form of a block, brick, film, layer, coating, or other form. The precursor may be provided in the form of a layer of precursor over the entire surface of the supporting structure, or on a selected portion or portions of the supporting structure. The precursor when provided in a layer, may have a differential morphology over its thickness, with an outer crust overlying a granular underlayer of solid in continuous or divided, e.g., particulate, form. Such crusted layer may for example have a caked texture formed by heat treating or deposition on the supporting structure of a solution or suspension of divided solids followed by solvent removal to leave the divided solids in place as a layer on the supporting surface.

The precursor may be a solid, semisolid, gel, or liquid precursor. Solids may be sublimable in character, passing from solid to vapor phase without an intermediate phase transition, or may be volatilizable with the occurrence of a solid to liquid to vapor transitioning. When a precursor solid has a high vapor pressure, volatilization may be effected by pressure reduction, as discussed, and/or heating of the precursor solid. It will be appreciated that the volatilization of the precursor may be effected in any of numerous ways, depending on the specific precursor, required flux of precursor vapor for the desired end use, process equipment involved in the vapor utilization, and process conditions.

Flow passages used in trays in the broad practice of the present disclosure may be of any suitable type, as openings through the tray in which gas can flow. Such openings may simply comprise perforated openings through the tray or may be bounded by structure that circumscribes or otherwise bounds the flow opening and channels or directs the gas flow. The flow passage may comprise a protuberance, i.e., a structural extension to above or below the main body of the tray defining the supporting surface of the tray. Flow of gas through the tray or fit disk may be accommodated by porosity therein, which may include pores of any appropriate size, shape, distribution, and tortuosity character. The pores may be of any suitable scale, e.g., macropores, micropores, nanopores, etc., or of a desired range, within a desired spectrum of dimensional limits anywhere from nanometer to millimeter or even larger dimensions.

Frits and fritted structures, e.g., frit disks, may be formed with porosity comprising extensive networks of interconnected pores that accommodate gas permeation therethrough. Such pores may be randomly oriented and highly tortuous in conformation, and thus are beneficially deployed to reduce entrainment of fine solids in flowing gas streams, as well as to provide a structure through which gas can penetrate, but which may be used to support a precursor thereon.

The precursor may be provided on the supporting surface of a tray, frit disk, or other structural member before installation thereof in the interior volume of the vaporizer, e.g., by forming a layer of precursor on surface of a tray or frit disk, with treatment of the precursor before, during, or after such application. For example, a layer of precursor may be formed by solvent treatment on a tray or frit disk, and the applied precursor dried, cured or otherwise processed to form the precursor for volatilization. The trays or frit disks bearing the precursor then may be installed in the vaporizer vessel. In other embodiments, the vaporizer may be assembled with trays or frit disks, with precursor thereafter being applied to the surfaces of such structural members, in situ. Thus, where appropriate, treatment of the precursor may occur before "loading in" the tray in the vaporizer, or while in the tray but before placing the tray in the vaporizer vessel, or in the vaporizer vessel, but before the lid or cover of the vaporizer is installed to close the vaporizer vessel. Solvent treatment of precursor may be beneficial in some embodiments in carrying out recrystallization of the precursor to enhance the rate of precursor vapor generation in operation of the vaporizer.

As an illustrative example of a specific precursor, the precursor in various embodiments may comprise a magnesium precursor such as dicyclopentadienyl magnesium ($Cp_2Mg$), which may be applied to a tray or frit disk in any suitable manner. Benzene or other suitable aryl solvent may be added to the $Cp_2Mg$ and removed from the $Cp_2Mg$ after loading in the tray. The $Cp_2Mg$ does not dissolve in benzene, and the solvent treatment may therefore not involve dissolution, but in other cases, a solvent that is effective for dissolving or suspending the precursor may be employed for treatment to enhance the character of the precursor for subsequent volatilization.

Solvents potentially useful for such purpose include, without limitation, aliphatic solvents, aromatic solvents, and other solvating, treating, and/or suspending media, such as alcohols, glycols, $C_3$-$C_{10}$ hydrocarbon solvents, ketones, benzene, toluene, xylene, naphthalene, glymes, amines, amides, etc.

In various embodiments, the disclosure relates to retrofitting or adapting a vaporizer previously used for bottom-up flow of gas so that it thereafter is configured for top-down flow of gas therein. This retrofitting or adaptation can be simply effected in vaporizers having dedicated inlets and outlets by switching flow circuitry associated with the "old" inlet so that it becomes the "new" outlet" and by contemporaneously switching flow circuitry associated with the "old" outlet so that it becomes the "new" inlet. Thus, a carrier gas supply line coupled to a carrier gas supply vessel may be uncoupled from the former inlet of the vaporizer vessel arranged for bottom-up flow, and re-connected to the former outlet so that the vaporizer vessel by such change is reconfigured for top-down flow of carrier gas through the interior volume of the vessel.

Thus, the disclosure contemplates reconfiguring an existing bottom-up flow vaporizer to reverse the gas flow therethrough to a top-down flow mode. In this manner, trayed and/or fit disk vaporizers can be modified to achieve higher levels of precursor vapor loading in the carrier gas, such as by the achievement of saturation of the carrier gas with the precursor vapor to maximize the flux of the precursor vapor from the vaporizer vessel. When such flow reversal modification is effected, it may be concurrently desirable to retrofit the interior volume of the vaporizer with one or more frit disks, e.g., at an upper and/or lower end of the vaporizer interior volume, in addition to or in replacement of a tray in the vaporizer vessel. The frit disks may be selected with a specific porosity that is coordinated, e.g., matched, to the porosity of a precursor material supported thereon, when the frit disk is employed as a precursor support structure. The frit disk can thereby act as a diffuser plate to prevent or reduce channeling through the precursor, as well as to suppress "particle blowout," i.e., gross carryover of precursor material particles in the gas being discharged from the vaporizer for use, because of the tortuous path of gas passing through the porosity of the fit disk.

In one embodiment, the disclosure relates to a method of enhancing performance of a vaporizer configured for bottom-up flow of carrier gas through an interior volume of the vaporizer, from an inlet of the vaporizer to an outlet of the vaporizer, said method comprising reconfiguring the vaporizer so that carrier gas is flowed to the interior volume of the vaporizer from the outlet and discharged from the interior volume of the vaporizer through the inlet so that the vaporizer is reconfigured for top-down flow of carrier gas through the interior volume of the vaporizer.

Such method may further comprise installing at least one frit disk in the interior volume. The method may be conducted, wherein an array of trays is disposed in the interior volume of the vaporizer, with at least one of the array of trays arranged to support precursor thereon. The trays in such method may comprise multiple gas flow passages therethrough.

Referring to the drawings, FIG. 1 is perspective view of a vaporizer of a general type susceptible to modification in accordance with the present disclosure.

The vaporizer 10 comprises a vessel 12, fabricated of a suitable heat-conducting material. Illustrative materials of construction for the vaporizer include stainless steel, graphite, silver, silver alloy, copper, copper alloy, aluminum, aluminum alloy, lead, nickel clad, silicon carbide coated graphite, boron nitride, ceramic material, etc., as well as combinations, mixtures and alloys of two or more of such types of material.

The vessel comprises a floor 14 and circumscribing sidewall 16 that together form an interior volume of the vessel. The vessel can have any shape that facilitates an even flow of carrier gas through the interior volume thereof. In one embodiment, the vessel has a cylindrical shape machined to very close tolerances (e.g., in a range of $1/1000^{th}$ to $3/1000^{th}$ of an inch (25.4 μm to 76.2 μm).

The vessel includes a lid 18 on which is mounted a carrier gas inlet valve 20 arranged to selectively introduce carrier gas into the interior volume of the vessel, when the valve is open, and a gas outlet valve 40 for dispensing of the vaporized material from the vaporizer vessel.

Positioned in the internal volume of the vessel is a plurality of vertically stacked trays 22. The stacked trays are separable from each other and removable from the vessel for easy cleaning and refilling. Positioned within the vessel is an internal carrier gas downtube 23 that is connected (welded) to a gas inlet in the lid associated with inlet valve 20 and conveys the carrier gas to the bottom of the internal volume below the lowest tray in the array of vertically stacked trays. In FIG. 1, the downtube 23 passes through a cylindrical collar of each tray that extends through the floor of the tray. It will be appreciated that to ensure a leak-proof seal at the juncture of the downtube with the floor of the tray, a sealing O-ring 38 may be positioned between successive trays. An additional outer o-ring can also be employed to seal between trays on the top surface of each tray sidewall.

The vertically stacked trays are provided with probtruberances or through-tubes 30 through which the carrier gas flows. The trays hold a sold precursor material for volatilization upon heating thereof. The heating may be carried out with thermal energy being inputted to the vessel to conductively heat the trays mounted in the vessel so that the precursor material in the trays is heated sufficiently to volatilize the precursor material. The volatilized precursor then is entrained in the carrier gas flowed through the interior volume of the vaporizer vessel and carried out of the vessel in such carrier gas in the dispensing operation. Additionally, or alternatively, to the heating of the vaporizer vessel with thermal energy input, the carrier gas itself may be heated to appropriate temperature to effect or assist in the volatilization of the precursor when the carrier gas is contacted with the precursor Each of the individual trays 22 has a floor and sidewall to form a tray cavity for placement and support of the source material. The trays are preferably fabricated of a non-reactive heat-conducting material, such as for example stainless steel, silver, silver alloy, copper, copper alloy, aluminum, aluminum alloy, lead, nickel clad, graphite, silicon carbide coated graphite, boron nitride, ceramic material, and combinations, mixtures and composites of two or more of the foregoing.

Each of the individual trays comprises a plurality of through-tubes 30 providing a passageway for movement of carrier gas through the through-tube. The through-tubes can have any shape or configuration that provides for flow of gas therethrough. For example, the through-tubes may be cylindrical or conical in shape. The through-tubes in various embodiments extend upwardly from the floor of the tray and define a central passageway communicating with a corresponding opening in the tray floor. In other embodiments, the through-tubes extend upwardly from the floor the tray in the same manner, but also extend downwardly below the tray, so that the central passageway is enclosed by the through-tube, e.g., as a central bore thereof, both above and below the floor of the tray.

The through-tubes can be secured to the floor of the tray in any suitable matter, e.g., by welding, brazing, mechanical fastener attachment, press-fit, swaging, etc. In the alternative, the through-tubes can be integrally formed as part of the tray floor. In a specific embodiment, the height of each of the through-tubes is approximately the same height as that of the tray sidewall, although other embodiments are contemplated, in which the height of each of the through-tubes is greater or less than such sidewall.

The side walls of the respective trays may be of sufficient height, so that the trays are stackable to form a vertically extending stacked array in the interior volume of the vessel of the vaporizer.

In another embodiment, the trays may be fabricated with sidewalls that are only of sufficient dimensional extent as to allow mounting or fixation to the interior wall surface of the vaporizer vessel.

In other embodiments, the trays may be fabricated without sidewalls, and may be mounted in the interior volume with the aid of supports on the interior wall surface of the vessel, with circumferential sealing gaskets, or other mounting structure or elements. Additional embodiments are contemplated, in which the trays are mounted in vertically spaced-apart relationship to one another, as an assembly. For example, the trays can be mounted on a frame or other positioning structure, as a unitary array that is inserted into and withdrawn from the interior volume of the vessel, as desired, during the assembly and disassembly of the vaporizer.

In one embodiment, each of the trays has a circumscribing sidewall, and the height of each through-tube is less than the height of the tray sidewall, thereby providing a head space above the end of the through-tube for gas dispersion and circulation within the respective tray.

Alternatively, the through-tubes and trays can be configured to create fluidized beds in each of the trays, or the trays can be fabricated with porous openings therein, so that solids or other source reagent material is initially supported on the top surface of the tray, with the carrier gas being flowed through the through-tubes or porous openings, at sufficient superficial velocity to fluidize the source reagent. For such purpose, the source reagent preferably is in a powder or other finely divided solid form, so that the pressure drop associated with the fluidization is not excessive. In such arrangement, the dimensions of the through-tubes or porous openings may be sufficiently small as to retain the solids supported on the tray in the absence of fluidizing gas flow.

More generally, the through-tubes desirably have a height that provides a leak-proof region for placement of a sufficient quantity of source material, to provide the required vaporized material without leakage of solids or liquid into the underlying container through the open passageways of the through-tubes. In one embodiment, each through-tube extends vertically upwardly from the bottom of the tray to a height that can for example be in a range of from about 0.5 mm to about 5 mm, and more preferably in a range of from about 1.5 mm to about 3.0 mm.

As shown in FIG. 1, the positioning of the through-tubes in each tray is slightly offset from the positions of the through-tubes in an adjacent tray, thereby forcing the carrier gas to circulate within the tray for contact of the carrier gas with the vaporized source material before the resulting gas mixture is transported through the through-tubes into the next-adjacent tray region. By such arrangement, the multiple levels of contacting of the carrier gas with the source reagent material permits the carrier gas to become saturated in a highly efficient manner.

The size of the vaporizer delivery system 10 can be widely varied depending on the amount of the vapor to be supplied to the downstream fluid-utilizing installation, such as a CVD apparatus, plasma doping system, or ion implantation system. In one embodiment, the vaporizer has a cylindrical conformation with an inner diameter in a range of from about 3 to 6 inches, e.g., about 3.75 inches. The number of trays in the interior volume of the vaporizer vessel will be determined by the size of the vaporizer. In various embodiments, from three to five trays are enclosed in the vaporizer vessel.

The vaporizer containing a multiplicity of trays can be heated and kept at a desired temperature appropriate to the specific source material to be vaporized, the desired concentration of the source reagent in the carrier gas mixture that is delivered to the downstream fluid-utilizing facility from the vaporizer, and the specific set of operating conditions that is employed in the source reagent vaporization operation.

Heating of the vaporizer vessel can be conducted in any suitable manner. In one embodiment, a ribbon heater is wound around the vaporizer. In another embodiment, a block heater having a shape covering at least a major portion of the external surface of the vaporizer is employed to heat the vaporizer vessel. In still another embodiment, a heat transfer fluid at elevated temperature may be contacted with the exterior surface of the vaporizer vessel, to effect heating thereof. A further embodiment involves heating by infrared or other radiant energy being impinged on the vaporizer vessel.

The invention in a further embodiment contemplates heating of the source reagent by circulation of a hot gas inside or outside the vessel, to effect convective heating of the source reagent.

The method of heating of the vaporizer vessel is not particularly limited as long as the vaporizer is brought thereby to a desired temperature level and maintained that such temperature level in an accurate and reliable manner for dispensing of the generated vapor of the source material.

It is desirable to heat the vaporizer vessel in a thermally homogeneous fashion, so that temperature deviations in the interior volume of the vessel are minimized. In specific embodiments, in which the trays are in direct thermal contact with the wall, heating of such trays via thermal conduction from the wall affords a convenient and effective way to vaporize the source reagent on the trays.

It may be desirable in some applications to utilize added surface area structures in the interior volume of the vaporizer vessel, to enhance the extent and rate of heating of the source reagent material for vaporization thereof.

As another expedient for achieving high efficiency vaporization of the source material, the carrier gas may be heated prior to its introduction to the interior volume of the vaporizer vessel, to assist the heating of the source reagent and vaporization thereof. For example, the flow line supplying the carrier gas to the inlet valve 20 may be heat-traced, or otherwise subjected to heating, to effect delivery of the carrier gas to the vaporizer vessel at a desired temperature level.

In a specific arrangement for vapor delivery from sublimable solid source reagents, the vaporizer delivery system of the present invention utilizes a series of heated trays including a plurality of heated through-tubes that increase the heated surface area, thereby enabling sublimation of solid source material to be achieved in a highly efficient manner as a result of the increased distribution of heat.

In some applications, it may be desirable for the vaporizer vessel to have a large thermal mass, in order to maintain a more consistent temperature during processing. The use of a large thermal mass can be particularly important in applications involving sublimation of a solid source material from the solid state to the vapor state. At a given temperature, the vapor pressure of a solid is the partial pressure of that material at the solid/gas interface, that is, there are as many molecules condensing on the solid surface as the number of molecules sublimating from the surface at a given time period. Equilibrium is destroyed if the molecules in the gaseous state are removed from the solid/gas interface by the carrier gas. Clearly, sublimation takes place at a higher rate to restore equilibrium, if there is enough heat supplied to the surface of the solid to compensate for the latent heat of sublimation of the solid. By providing a plurality of heated through-tubes on heated trays associated with heated vaporizer vessel walls, the entire heat-conductive container functions to increase the rate of sublimation, to produce an increased flow rate of saturated carrier gas and reduce the precipitation of vaporized source material that can clog the through-tubes or other pores or channels of the trays.

The specific temperature of the vaporizer that is employed in a given application will depend on the operating conditions of the downstream fluid-utilizing apparatus, e.g., CVD apparatus or ion implantation system, and the vapor pressure and the amount of the source material that is provided. In various specific embodiments in which sublimable solid source reagents are employed, vaporizer temperatures in a range of from about 20° C. to about 300° C. can be employed. Implementations of the present invention involving metal halide solid source reagents can for example utilize temperatures in a range of from 200° C. to 300° C., in specific embodiments.

The vaporizer delivery system of the present disclosure can in specific embodiments further comprise flow circuitry and associated components coupled or coupleable with the vessel: lines for supplying a carrier gas to the vaporizer vessel; lines for discharging source reagent vapor from the vaporizer vessel; flow circuitry components such as flow control valves, mass flow controllers, regulators, restricted flow orifice elements, thermocouples, pressure transducers, monitoring and control devices, heaters for input of thermal energy to the vaporizer vessel and its contents, heaters for maintaining temperature in the carrier gas supply lines and source reagent vapor discharge lines, etc.

In some embodiments of the invention, heating of source reagent vapor discharge lines is conducted to maintain the temperature of such lines 5-10° C. hotter than the vaporization temperature in order to prevent condensation in such discharge lines.

In the use of vaporizer systems of the type described above, the source reagent material can be introduced into the vaporizer vessel, contained in or coated or reposed on the trays or otherwise disposed in the interior volume of the vaporizer vessel, prior to securing the cover to the vessel (see FIG. 1, wherein the cover 18 is secured by bolt mechanical fasteners to the vessel). The source reagent material may be in any suitable form, including solid form, liquid form, semi-solid form, or a solution containing the source reagent material dissolved or dispersed in a suitable solvent medium.

In one embodiment, the source reagent material is provided in the form of a deposit, coated on the surfaces of the trays and through-tubes within the tray cavity as a film or coating of suitable thickness. Such film or coating may be formed by any of various suitable methods, including the method of melting the source reagent by heating same, applying the molten source reagent material to the surfaces of the trays and through-tubes and then cooling the applied material.

In another embodiment, wherein the source reagent comprises a metal complex, the metal complex can be dissolved in a solvent and the resulting solution applied to the surfaces of the trays and through-tubes, followed by removal of the solvent from the applied material under reduced pressure.

In some embodiments, it may be desirable to concurrently supply different source reagent vapor species from the vaporizer vessel to a downstream fluid-utilizing installation. In such applications, different source reagent materials can be provided on different trays and/or in different cartridges in the vaporizer vessel interior volume. By such arrangement, it is possible to generate a multicomponent vapor that is carried by the carrier gas to the downstream facility.

The vaporizer thus can include a plurality of vertically stacked trays mounted on a central downtube in the interior volume of the vaporizer vessel. The source reagent material can be loaded into the interior volume of the vessel, by charging of the trays with predetermined amounts of the source reagent, e.g., a metered amount of particulate solids. After such loading of the source reagent in the vaporizer vessel, the top lid 18 of the vessel is positioned on the top of the vessel and sealed thereto, such as by an o-ring element fabricated of polytetrafluoroethylene or an elastomer, or by a metal seal element and/or by mechanical fasteners, such as bolt fasteners.

After assembly of the vaporizer, and coupling of the vaporizer vessel with process lines for delivery of carrier gas to the vessel, and discharge from the vessel of carrier gas mixture containing the source reagent vapor, a vaporizer heater may be actuated to effect heating of the vaporizer vessel. The heating is conducted so that the internal temperature within the vaporizer and contacting trays is increased to a temperature sufficient to vaporize the source material.

In the case of a sublimable solid, the sublimation rate will be greatest on the first or lowest tray due to the pure carrier gas entering that tray, as opposed to the partially or fully saturated carrier gas entering the trays above it. As such, it may be necessary to load more source reagent material on the bottom tray and/or to increase the height dimension of the container to enable the desired amount of source reagent vapor to be generated and flowed to the downstream fluid-utilizing facility.

The vaporizer shown in FIG. 1 is advantageously employed for generating vapor from a wide variety of source reagent materials, and has particular utility for volatilization of sublimable solids such as decaborane, hafnium tetrachloride, bis cyclopentadienyl magnesium, trimethylindium, and the like. The vaporizer may be employed in various applications for volatilization of solid source materials, e.g., solid materials characterized by sublimation temperatures in a range of between about 20° C. to about 300° C. and vapor pressure in a range of from about $10^{-2}$ Torr to about $10^3$ Torr at its sublimation temperature.

Temperature may be controlled within the vaporizer by any heat regulating system including, without limitation, strip heaters, radiant heaters, heated enclosures, circulating fluid heaters, resistant heating systems, inductive heating systems, etc., as constructed and arranged for controlled temperature operation. Further, temperature within the vaporizer can be sensed by a thermocouple, thermistor, or any other suitable temperature sensing junction or device arranged for contacting a surface of the thermally conductive vessel and/or trays therein. Such temperature sensing device can be operatively coupled with a central processing unit, such as a general-purpose programmable computer, programmable logic unit, microcontroller, etc., as arrange to receive temperature sensing signals from the temperature sensing device, and to responsively modulate the heater, and/or other controllable elements of the vaporizer system, to achieve a desired production of source reagent vapor for the specific application involved.

To determine when the vaporizer is depleted of source material, a level sensor monitoring system can be employed to determine the amount of source material on one or more trays in the interior volume of the vaporizer vessel, such as an optical sensor communicatively connected to a reflective surface on the bottom surface of a tray to provide a change in signal when the tray is near empty or empty.

The amount of power required for complete vaporization is a function of the chemistry of the source material and carrier gas, and the flow rate of the mixture. In a specific embodiment, the thermal power transferred to the vaporizer can be in a range of from about 100 W to about 3000 W to provide highly efficient isothermal temperatures for the source reagent vaporization.

For operation of the vaporizer, a solid source reagent material can be loaded into the trays in a dry box or glove box, to eliminate the reaction of the precursor with oxygen and moisture while the vaporization vessel is open. The vessel in the dry box or glove box then is loaded with the source reagent-containing trays, and the lid is applied and secured in position, to yield the closed vaporization vessel. The vessel then is coupled with the feed and discharge lines for carrier gas ingress and vapor-containing carrier gas mixture discharge, in the process system.

A carrier gas from a suitable gas source then is introduced into the vaporizer in carrier gas inlet 20, e.g., at a gas flow rate in a range of from 1 to 10,000 standard cubic centimeters per minute (sccm). In some embodiments, carrier gas flow rates of 100 sccm to 10,000 sccm (10 liters/minute) may be employed. The carrier gas is transported into the vaporizer at an appropriate pressure, and flows from the lower portion of the vessel, where it is introduced, outwardly and upwardly through the interior volume, through the successive trays and through-tubes thereof.

As the carrier gas flows upwardly through the different levels of the vertically stacked trays, the carrier gas becomes saturated with vaporized source reagent material. The resulting carrier gas mixture containing the source reagent vapor then flows out of the vaporizer at gas outlet valve 40 to a process chamber or other gas-receiving facility or tool, in which the dispensed source reagent vapor-containing carrier gas mixture is processed or utilized. In various specific embodiments, such process chamber comprises an atomic layer deposition chamber or an ion implantation chamber.

Solids precursors with which the vaporizer can be usefully employed are of any suitable type, including solid-phase metal halides, organometallic solids, and the like. Examples of source reagents that may be utilized in various applications include, without limitation, dimethyl hydrazine, trimethyl aluminum (TMA), trimethyl indium (TMI), bis cyclopentadienyl magnesium ($Cp_2Mg$), tris ethylcyclopentadienyl yttrium (($EtCp)_3Y$), hafnium chloride ($HfCl_4$), zirconium chloride ($ZrCl_4$), indium trichloride, aluminum trichloride, titanium tetraiodide, tungsten carbonyl, $Ba(DPM)_2$, bis di pivaloyl methanato strontium (Sr $(DPM)_2$), $TiO(DPM)_2$, tetra di pivaloyl methanato zirconium ($Zr(DPM)_4$), decaborane, boron, magnesium, gallium, indium, antimony, copper, phosphorous, arsenic, lithium, sodium tetrafluoroborates, precursors incorporating alkyl-amidinate ligands, organometallic precursors, zirconium tertiary butoxide (Zr (t-$OBu)_4$), tetrakisdiethylaminozirconium ($Zr(Net_2)_4$), tetrakisdiethylaminohafnium ($Hf(NEt_2)_4$), tetrakis (dimethylamino) titanium (TDMAT), tertbutylimino-tris (deithylamino) tantalum (TBTDET), pentakis (demethylamino) tantalum (PDMAT), pentakis (ethylmethylamino) tantalum (PEMAT), tetrakisdimethylaminozirconium (Zr(NMe$_2$)$_4$), hafniumtertiarybutoxide (Hf(tOBu)$_4$), xenon difluoride (XeF$_2$), xenon tetrafluoride (XeF$_4$), xenon hexafluoride (XeF$_6$), and compatible combinations and mixtures of two or more of the foregoing.

Thus, in the vaporizer shown in FIG. 1, as described above, the carrier gas is introduced from the top end and flows through a downwardly extending feed tube to a bottom portion of the vessel for subsequent distribution and upward flow through each tray in the interior volume of the vessel. In such manner, the vessel, when heated, conductively heats the trays in the vessel interior volume, to produce vapor deriving from the source reagent on the trays. The generated vapor then is entrained in the carrier gas. The resulting carrier gas mixture including the source reagent vapor then is discharged from the vaporizer at the top end thereof through an output port of the vessel having a discharge valve therein.

We have unexpectedly found that in a vaporizer of a type as shown in FIG. 1, as utilized for low flow rate operation in dispensing of vapor by upflow of carrier through the respective trays, but susceptible to producing progressively more unsaturated carrier gas with increasing carrier gas flow rate, it is possible to substantially increase the saturation of carrier gas by reversing the flow of the carrier gas through the interior volume of the vaporizer, so that it flows from top-to-bottom, rather than from bottom-to-top.

This reversal of flow can be effected by changing the carrier gas supply line from coupling with the carrier gas inlet valve 20 to coupling with the gas outlet valve 40, and concurrently changing the vaporizer dispensing line from coupling with the gas outlet valve 40 to coupling with the carrier gas inlet valve 20 so that the former inlet becomes the discharge, and the former discharge becomes the carrier gas inlet, resulting in the desired top-to-bottom flow arrangement for the carrier gas.

By this reversal of flow of the carrier gas to a top-to-bottom flow arrangement, the flow passages in the top tray channel the carrier gas introduced at the upper end portion of the vaporizer vessel above such top tray through the flow passages so that it directly contacts the solid source material on the next-lower tray. This direct impingement of the carrier gas creates better contact of the carrier gas with the solid and increases both the contact time and turbulence tray-to-tray, and improves the saturation character of the carrier gas.

This improvement in solid source material contact and solid source vapor transport, in top-to-bottom flow as compared to bottom-to-top flow, was demonstrated using Cp$_2$Mg as a model solid precursor in identical process conditions using computer simulation techniques, as well as being confirmed by direct experimental measurements.

In the simulation modeling, a six-tray vaporizer assembly was hydrodynamically simulated to assess carrier gas velocity profiles and flow dynamics, and determine flux data for the Cp$_2$Mg precursor. The simulation was conducted for the process conditions shown in Table 1 below.

TABLE 1

Temperatures 20° C.
Pressure: 500, 900 torr
Material: Cp$_2$Mg
Fill level: 50%
Flow rate: 0.1, 1.0, and 10 slm - From Top to Bottom
Saturation concentration: 0.0017 mol/m3
Saturation pressure: 4.1 Pa (0.03 Torr)

The average concentration data for the six-tray vaporizer assembly is set out in Table 2 below (wherein Tray 1=bottom tray in the assembly and Tray 6=top tray in the assembly).

TABLE 2

| | | Average Concentration $\langle c/c_{sat} \rangle$, % | | | | | |
|---|---|---|---|---|---|---|---|
| Pressure | Inflow rate | Tray 1 | Tray 2 | Tray 3 | Tray 4 | Tray 5 | Tray 6 |
| 500 torr | 0.1 slm | 100 | 100 | 99.9 | 99.8 | 98.6 | 85.2 |
| | 1 slm | 99.5 | 98.9 | 97.6 | 94.4 | 86.7 | 67.9 |
| | 10 slm | 97.8 | 96.1 | 93.8 | 89.2 | 80.5 | 62.6 |
| 900 torr | 0.1 slm | 100 | 100 | 100 | 100 | 99.5 | 90.8 |
| | 1 slm | 100 | 99.8 | 99.5 | 98.3 | 94.0 | 78.2 |
| | 10 slm | 99.0 | 98.0 | 96.7 | 93.1 | 86.2 | 69.6 |

← Downward Flow in Tray

A comparison was then made of downflow vs. upflow arrangements for the six-tray vaporizer assembly, with the results shown in Table 3 below.

TABLE 3

| | | Average Concentration - Comparison $\langle c/c_{sat} \rangle$, % | |
|---|---|---|---|
| Pressure | Inflow rate | Bottom-Up Flow Tray 6 Baseline Flow | Top-Down Flow Tray 1 Modified Flow |
| 500 torr | 0.1 slm | 100 | 100 |
| | 1 slm | 98 | 99. |
| | 10 slm | 59 | 98 |
| 900 torr | 0.1 slm | 100 | 100 |
| | 1 slm | 100 | 100 |
| | 10 slm | 72 | 99 |

An outlet volume rate was then assessed for the six-tray vaporizer assembly in respective upflow and downflow modes, with the results shown in Table 4.

TABLE 4

| | | Outlet Volume Rate @ STP - Normalized - Comparison | |
|---|---|---|---|
| Pressure | Inflow rate | Bottom-Up Flow Tray 6 Baseline Flow | Top-Down Flow Tray 1 Modified Flow |
| 500 torr | 0.1 slm | 100% | 100% |
| | 1 slm | 100% | 99% |
| | 10 slm | 56% | 98% |
| 900 torr | 0.1 slm | 100% | 100% |
| | 1 slm | 100% | 100% |
| | 10 slm | 72% | 99% |

The foregoing results showed that the reversed flow arrangement (top-to-bottom) yielded higher outlet volume rates than the baseline flow condition at higher flow rates, with improvement in outlet volume rates observed at pressures of 500 and 900 torr.

We have also discovered that vaporizers adapted for low flow rate operation can be modified by making relatively small changes in the gas flow dynamics of the vaporizer. For example, using larger bore flow passages within the trays can provide for higher gas flows to be employed, while simultaneously minimizing the pressure drop across the vaporizer delivery system. In one specific embodiment, the diameter of the flow passages (flow passages) of the trays can be increased from 1/16 inch (0.15875 cm) inner diameter to ⅛ inch (0.3175 cm) or ¼ inch (0.635 cm) diameter. At the same time, the total number of flow passages per tray can be increased or decreased as necessary to allow uniform delivery of the solids at relatively high flow rates. Other similar changes can be envisioned, such as increasing the inner diameter on the inlet and outlet, and the associated valves on the vaporizer system.

Figure 2:
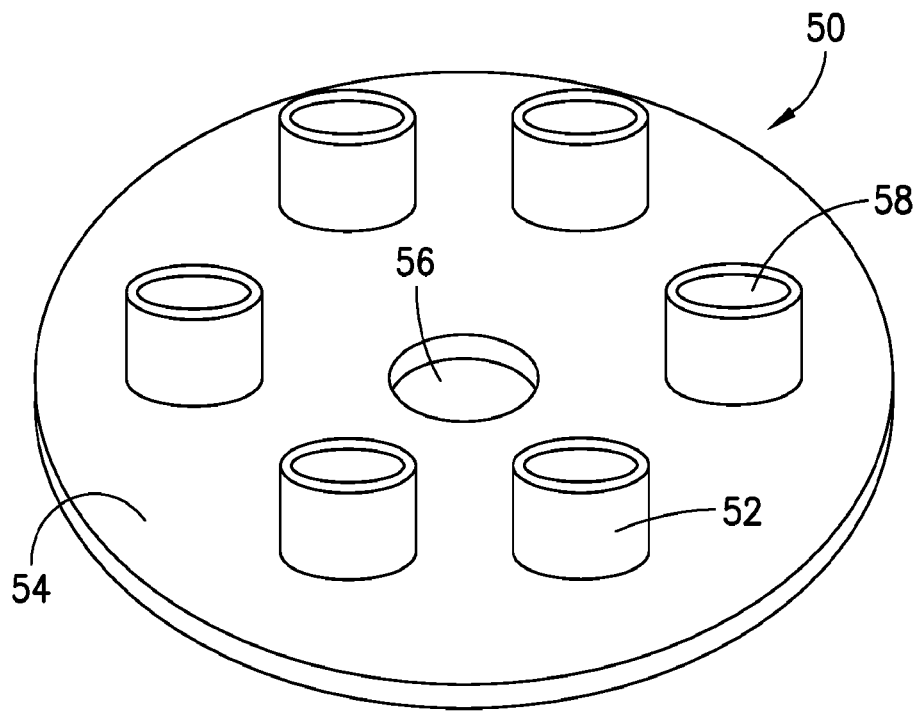
FIG. 2 is a perspective view of a vaporizer tray article, featuring large diameter flow passages, according to one embodiment of the present disclosure.

FIG. 2 is a perspective view of a vaporizer tray article 50, featuring large diameter flow passages 52, according to one embodiment of the present disclosure. The flow passages 52 are arranged in an array on the plate body 54 of the tray article and extending through such plate body, with their central bore passages 58 providing open area for flow of carrier gas through the flow passages. The flow passages may have an inner diameter in a range of from ⅛ to ¼ inch (0.3175 to 0.635 cm) or larger to accommodate high rate gas flow therethrough. The plate body 54 is formed with a central opening 56 to accommodate a gas flow tube extending therethrough (either as a carrier gas feed tube, as initially described for the vaporizer of FIG. 1, or as a source material vapor discharge tube, when the vaporizer is operated in a carrier gas top-to-bottom flow mode in the FIG. 1 vaporizer).

Figure 3:
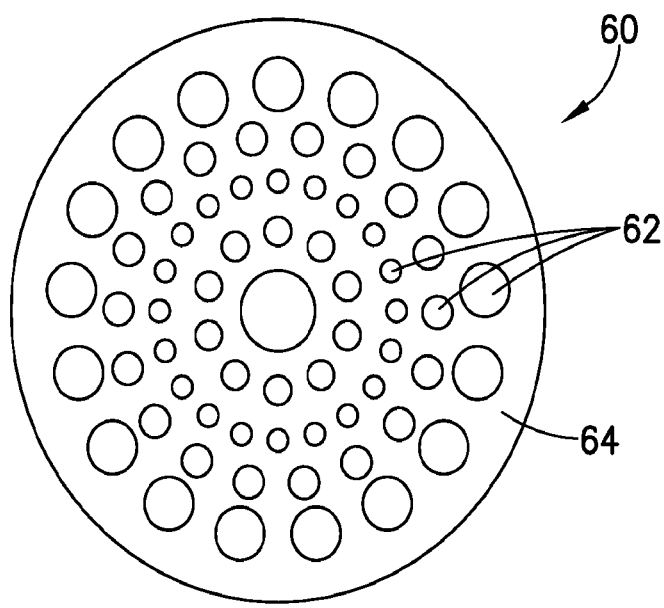
FIG. 3 is a top plan schematic view of a vaporizer tray article according to another embodiment of the disclosure, featuring flow passages or flow passages through the plate body that are of varied size.

FIG. 3 is a top plan schematic view of a vaporizer tray article 60 according to another embodiment of the disclosure, featuring flow passages 62 through the plate body 64 that are of varied size, with larger openings serving to accommodate higher flow rate conditions with lower pressure drop.

The solid source material in both FIG. 2 and FIG. 3 embodiments can be supported on the plate body of the tray article in a particulate form (that is sufficiently large so that particles do not fall through the flow passages in the FIG. 3 embodiment), or alternatively in the form of a coating of the solid source material on the plate body solid (imperforate) surface, as formed thereon from a melt or an applied solution or suspension of the solid source material. More generally, diffuser plates of varying configurations can be employed as tray articles, e.g., plates with arched slits.

Another approach for achieving high-flow, low pressure drop, and uniform delivery of source material vapor is to utilize arched slits in each tray within the solid delivery system. In this manner, the arched slits replace the flow passages employed in the tray articles shown in FIGS. 1-3, while still providing for uniform delivery of the solid precursor vapor from the vaporizer.

Figure 4:
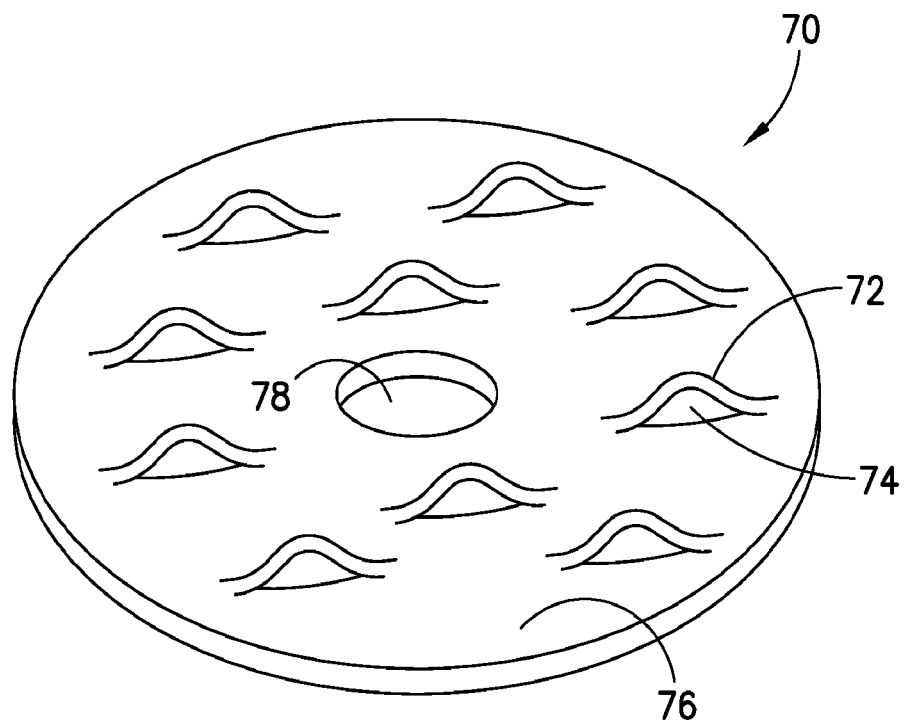
FIG. 4 is a perspective view of a tray article featuring a multiplicity of arched slits, according to another embodiment of the disclosure.

A perspective view of such a tray article 70 featuring a multiplicity of arched slits 72 is shown in FIG. 4. As illustrated, the tray article comprises a plate body 76 on which the arched slits 72 define a corresponding array of slit openings 74 through the tray body. The tray body features a central opening 78 to accommodate a gas flow tube extending therethrough (either as a carrier gas feed tube, as initially described for the vaporizer of FIG. 1, or as a source material vapor discharge tube, when the vaporizer is operated in a carrier gas top-to-bottom flow mode in the FIG. 1 vaporizer).

Figure 5:
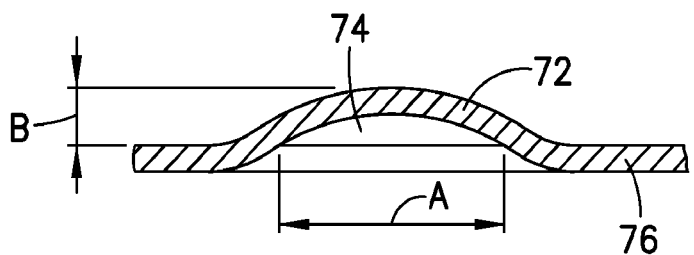
FIG. 5 shows an enlarged sectional elevation view of a portion of the tray article, showing the arched slit defining an opening through the plate body, wherein the slit opening has a width A and a height B measured from the top surface of the plate body to the crest of the arched portion of the tray article.

FIG. 5 shows an enlarged sectional elevation view of a portion of the tray article 70, showing the arched slit 72 defining an opening 74 through the plate body 76, wherein the slit opening 74 has a width A and a height B measured from the top surface of the plate body to the crest of the arched portion of the tray article.

In another aspect, the present disclosure contemplates the replacement of the trays in the vaporizer, e.g., as shown in FIG. 1, with fritted disks in order to improve precursor (source material) saturation at room temperature and high carrier gas flow rates, e.g., up to 2000 sccm (2 SLPM) or even higher at room temperature and elevated pressure. In various embodiments, carrier gas flow rates of from 100 sccm to 10,000 sccm (10 liters/minute) are utilized for precursor vapor delivery.

Figure 6:
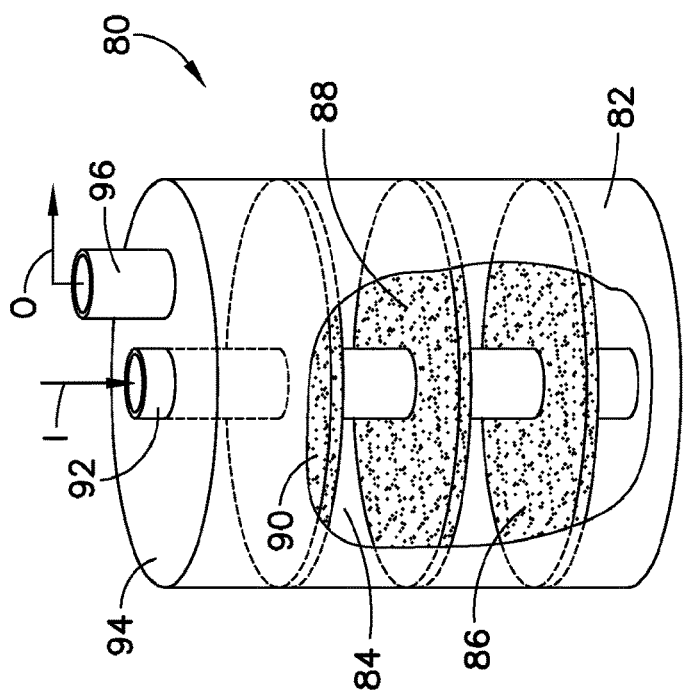
FIG. 6 is a perspective view of a vaporizer according to another embodiment of the disclosure, featuring a vertically extending array of spaced-apart fritted disks.

FIG. 6 is a perspective view of a vaporizer 80 according to another embodiment of the disclosure, featuring a vertically extending array of spaced-apart fritted disks 86, 88, and 90.

The vaporizer 80 includes a vaporizer vessel 82 that with cover 94 defines an enclosed interior volume 84 in which is disposed an array of the fitted disks 86, 88, and 90, as mounted on the centrally arranged carrier gas inlet tube 92. The carrier gas inlet tube 92 has an open lower end, to enable discharge of carrier gas, introduced in the direction indicated by arrow I, to be dispensed from the lower open end of the tube for subsequent flow upwardly through the fitted disks mounted on the tube. The carrier gas thereby contacts solid precursor material on the fritted trays (not shown in FIG. 6). The precursor material may be coated on the fritted disks, and/or supported thereon in the form of loose granules, and/or resident in the pores of the fritted disks. Under dispensing conditions, with the vaporizer vessel heated to volatilize the precursor material, the carrier gas contacts the precursor solids and entrains the precursor vapor, discharging it through outlet 96 of the vaporizer (with flow of discharged carrier gas and precursor vapor mixture being indicated by arrow "O").

Consistent with the preceding discussion, it will be recognized that the FIG. 6 vaporizer could be operated with gas flow tube 96 being used as an inlet for carrier gas, rather than as an outlet for the carrier gas/precursor vapor mixture, and with the gas flow tube 92 being used as an outlet for the carrier gas/precursor vapor mixture, rather than as a carrier gas inlet tube, in order to effect top-to-bottom flow of the carrier gas in the interior volume of the vaporizer.

Figure 7:
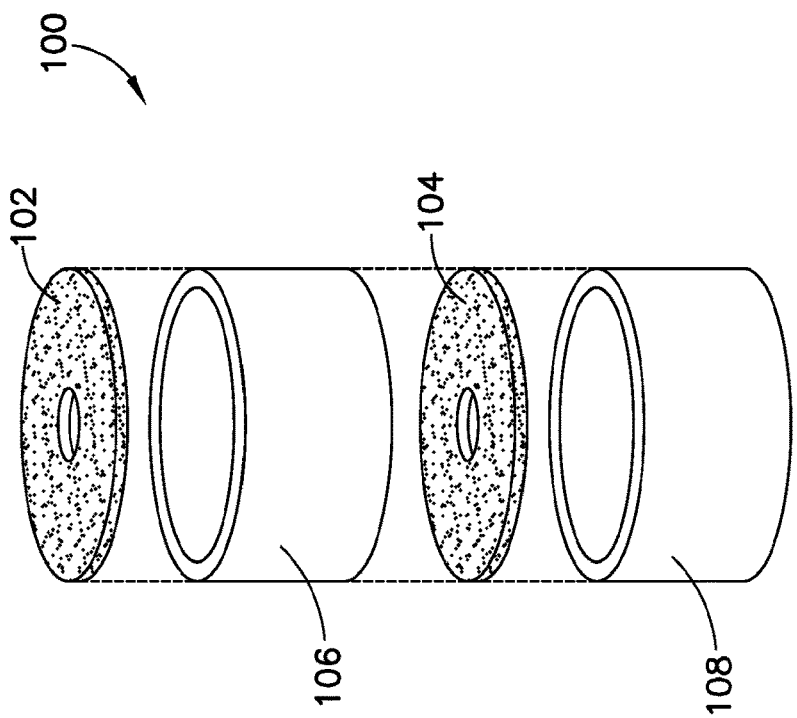
FIG. 7 is an exploded perspective view of a fritted disk and spacer ring assembly, suitable for use in a vaporizer vessel.

Rather than being mounted on the central gas flow tube 92 as shown in the FIG. 6 vaporizer, the fritted disks could be arranged as shown in FIG. 7, which is an exploded perspective view of a fritted disk and spacer ring assembly 100 comprising fritted disks 102 and 104, maintained in spaced relation to one another by the intervening spacer ring 106, and with the fritted disk 104 being reposed on spacer ring 108. By this arrangement, a vaporizer vessel can be assembled in a simple and ready manner, by simply dropping in a spacer ring, placing a fritted disk on it, dropping in another spacer ring, placing a further fritted disk on the second spacer ring, etc. The fritted disks can be processed to provide a layer or coating of source material thereon and/or source material within its porosity, prior to "laying in" a loaded fritted disk in the assembly, to assemble a vaporizer with the fritted disk array shown in FIG. 8.

Figure 8:
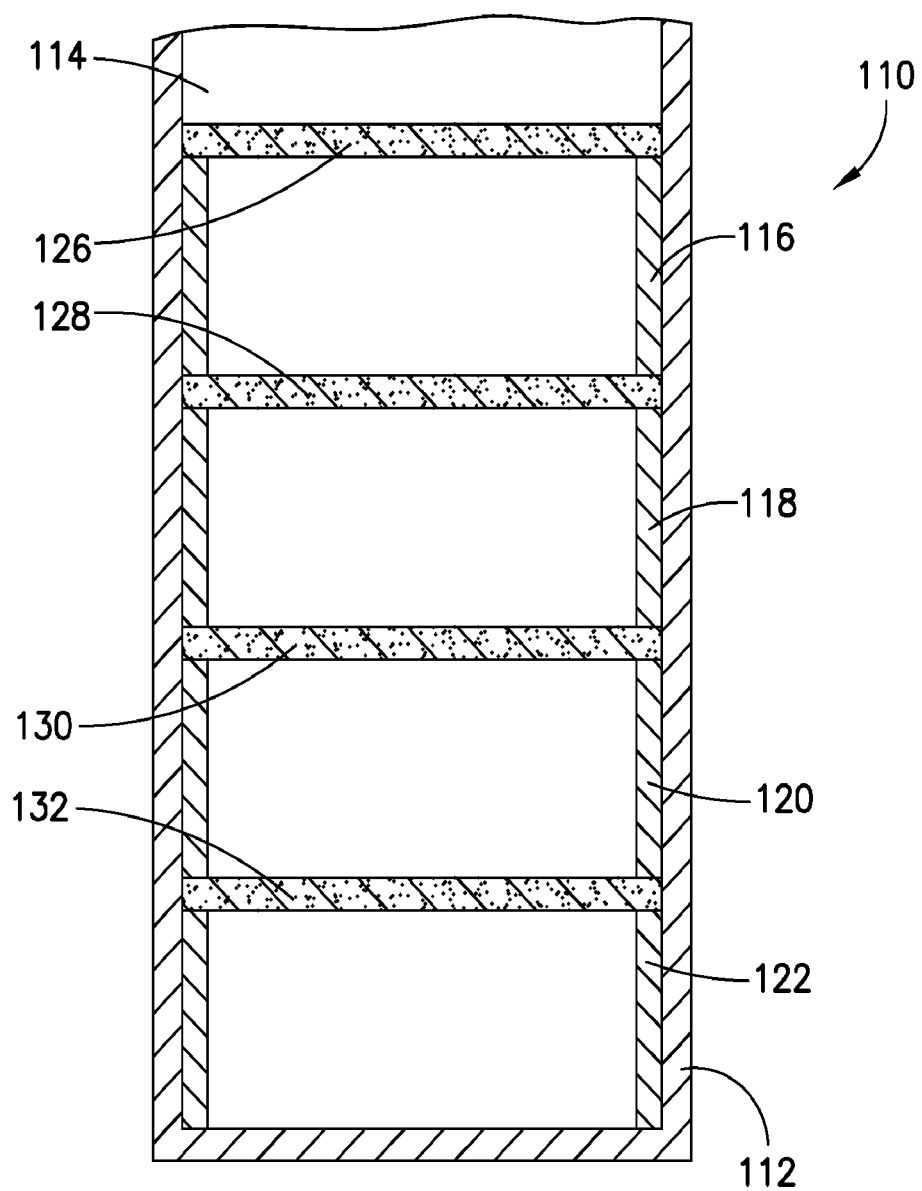
FIG. 8 is a sectional elevation view of a vaporizer incorporating a fritted disk and spacer ring assembly of a type as shown in FIG. 7.

FIG. 8 is a sectional elevation view of a vaporizer 110 incorporating a fritted disk and spacer ring assembly of the type shown in FIG. 7. FIG. 8 depicts a vaporizer 110 enclosing an interior volume 114 in which is disposed an array of fritted disks 126, 128, 130, and 132, reposed respectively on spacer rings 116, 118, 120, and 122, with the bottom spacer ring 122 reposing in turn on the floor of the vaporizer, as illustrated. The spacer rings are of a size to closely fit within the vessel 112 of the vaporizer and to present a circumferentially extended surface for supporting the periphery of the fritted disk that is reposed thereon. This arrangement enables quick and simple installation and removal of the fritted disks in use of the vaporizer. Any suitable number of disks may be employed in the assembly, e.g., from 4 to 20 disks in various embodiments.

In the assembled vaporizer, the top fritted disk in the array may be maintained free of any solid source material, so that such top fritted disk functions as a particle capture structure, to prevent entrainment and carryover of solids in the carrier gas/precursor vapor mixture being dispensed from the vessel in operation. The other disks may be loaded or incorporated with the solid source material in any suitable manner, as previously described. For example, the source material may be provided in a film or layer on an upper surface of the fritted disk, or the source material may be provided and particulate form and incorporated into the porosity of the fitted disk, which may be formed, e.g., by sintering or other suitable fabrication technique, to provide a porous, gas-permeable disk having porosity of a character accommodating such incorporated solid source material and desired gas flow therethrough for contacting with the solid source material.

In one illustrative embodiment, a vaporizer is provided comprising four porous frit disks and a top gas diffuser plate, and five spacer rings, wherein each of the four porous frit disks and top carrier gas diffuser plate is reposed on a separate one of the spacer rings in the stack, with the carrier gas arranged to flow downwardly through the uppermost gas diffuser plate and each of the respective porous frit disks in sequence. The porous frit disks have solid precursor material supported thereon, e.g., on an upper surface thereof, and/or in porosity of the porous frit disks. The top gas diffuser plate may in some embodiments be a porous frit disk that has no solid precursor material associated therewith. The vaporizer may include a top carrier gas inlet and a bottom carrier gas outlet, or a top carrier gas inlet and a top carrier gas outlet in spaced relationship to the inlet and arranged for egress of carrier gas and entrained precursor vapor as channeled from a lower portion of the vaporizer interior volume to the outlet.

In any of the vaporizers of the present disclosure, the tray assemblies may include one or more carrier gas diffuser plates that are provided with gas flow openings for distributing carrier gas in the interior volume of the vaporizer and that do not have precursor solid material supported thereon. In other embodiments, carrier gas diffuser plates may be employed that are arranged with precursor solid material supported thereon for gas/solid contacting.

Set out below is a tabulation of test results for various respective vaporizers, in which various directional flow modes were evaluated at various carrier gas flow rates, to determine whether the carrier gas in the gas mixture dispensed from the vaporizer was saturated with the precursor vapor. Saturation of the dispensed gas is highly desirable, since it correlates to highly efficient utilization of the carrier gas as a carrier medium for the precursor vapor. Stated alternatively, the achievement of saturation of the dispensed gas enables a correspondingly reduced volume of carrier gas to be utilized, relative to unsaturated operation in which a corresponding amount of precursor vapor is discharged from the vaporizer vessel in a larger volume of carrier gas.

In the comparative testing, a solid delivery system of the type shown in FIG. 1 was evaluated (Solid Delivery System 1), in which the vessel had an interior volume of 0.75 L, and a surface area of 326.46 $cm^2$ on which a solid dicyclopentadienyl magnesium precursor was supported. The vessel was heated with a high degree of heating uniformity. The carrier gas was introduced to the vaporizer vessel through a central inlet downtube open at its lower end, so that the discharged carrier gas flowed upwardly from the bottom region of the vessel through the flow passages in the respective trays to a headspace at the upper portion of the vessel, above the uppermost tray therein, for discharge from an outlet communicating with such upper portion of the vessel. In the course of such flow of the carrier gas through the interior volume of the vaporizer vessel, the carrier gas contacted the precursor on the successive trays and effected entrainment of the vapor deriving from the precursor. The vaporizer thus operated in a "bottom up" flow mode of operation. The vaporizer had six trays, with 8 g of precursor per tray.

A solid delivery system of the type shown in FIG. 1 was also operated in a top down flow mode (Solid Delivery System 2), with carrier gas introduced through the "outlet" to the headspace at the upper region of the vessel, above the uppermost tray therein, for downward flow through the flow passages in the respective trays to the bottom region of the vessel. During such flow, the carrier gas contacted the precursor on the successive trays and effected entrainment of the vapor deriving from the precursor. In the bottom region of the vessel, the carrier gas carrying the entrained precursor vapor enter the open lower end of the downtube, and flowed upwardly to the "inlet" upper end of the downtube, for discharge from the vessel. In such mode of operation, the downtube utilized for carrier gas introduction in Solid Delivery System 1 instead served as the discharge tube for carrier gas mixture dispensing from the vaporizer in Solid Delivery System 2, while the outlet utilized in Solid Delivery System 1 was instead used as the carrier gas inlet in Solid Delivery System 2. The vaporizer had six trays, with 8 g of precursor per tray.

The operating conditions in the "top-down" mode of operation in Solid Delivery System 2 were the same as those employed in the "bottom-up" mode of operation in Solid Delivery System 1, viz., with the vessel having an interior volume of 0.75 L, and a surface area of 326.46 $cm^2$ on which a solid dicyclopentadienyl magnesium precursor was supported, and with the vessel being heated with a high degree of heating uniformity.

The testing further included a Solid Delivery System 3 that was identical to Solid Delivery System 2 in configuration and operation (i.e., was operated in "top-down" mode of operation, as regards the flow of the carrier gas), but the solid dicyclopentadienyl magnesium precursor was recrystallized from benzene, and provided in such form on the supporting trays. The vaporizer had six trays, with 8 g of precursor per tray. The vaporizer was heated with a high degree of heating uniformity.

Another vaporizer utilized in the comparative testing (Solid Delivery System 4) utilized the vaporizer vessel with an interior volume of 0.75 L, but instead of the trays featuring flow passages as in Solid Delivery Systems 1-3, the Solid Delivery System 4 utilized porous frit disks as trays. The vessel contained five porous frit disks, in vertically spaced-apart arrangement, with the four lower disks providing 217.64 $cm^2$ support area on which each such fit disk supported 8 g of the solid dicyclopentadienyl magnesium precursor, and with the uppermost frit disk acting as a particulate solids barrier element, to restrict carryover of particulate solids in the carrier gas mixture discharged from the vessel. The carrier gas was flowed in a "bottom-up" mode of operation, with the carrier gas introduced to a lower region of the interior volume of the vaporizer vessel, below the lowermost frit disk, for flow upwardly through the porosity in the successive fit disks to a headspace in the upper region of the vaporizer vessel, from which the carrier gas mixture was discharged from the vaporizer. The vaporizer was heated with a good heating uniformity being achieved.

The results of the comparative testing of Solid Delivery Systems 1-4 is shown in Table 5 below.

TABLE 5

| Solid Delivery System | Saturated or Unsaturated Behavior at Flow Rate (standard liters per minute, SLM): | | | | Surface Area, cm² | Volume, Liters | Heating Uniformity | Flow Direction |
|---|---|---|---|---|---|---|---|---|
| | 1 SLM | 2 SLM | 5 SLM | 10 SLM | | | | |
| 1 | U | U | U | U | 326.46 | 0.75 | High | Bottom Up |
| 2 | S | S | U | U | 326.46 | 0.75 | High | Top Down |
| 3 | S | S | S | * | 326.46 | 0.75 | High | Top Down |
| 4 | S | S | S | * | 217.64 | 0.75 | Good | Bottom Up |

* not determined

The data show that in the upflow mode, i.e., "bottom-up" flow mode, for Solid Delivery System 1, the gas mixture discharged from the vaporizer was unsaturated in the precursor vapor, at all flow rates of 1, 2, 5, and 10 standard liters per minute of carrier gas, but that when the flow of carrier gas was reversed to a downflow mode, i.e., "top-down" flow mode (Solid Delivery System 2), the gas mixture discharged from the vaporizer was saturated at 1 SLM and 2 SLM volumetric flow rates, becoming unsaturated at the higher flow rates of 5 SLM and 10 SLM, and when the precursor solid was recrystallized from solvent in the downflow mode (Solid Delivery System 3), the gas mixture discharged from the vaporizer was saturated at 1, 2, and 5 SLM volumetric flow rates. In Solid Delivery System 4, in which the respective trays were constituted by frit disks, the upflow mode achieved saturated gas mixture delivery at the same volumetric flow rates, of 1, 2, and 5 SLM, as attained in the operation of Solid Delivery System 3.

The data show that the vaporizer containing frit disks in the interior volume as precursor solid support elements for the solid precursor, achieved the same superior behavior in upflow operation as the vaporizer utilizing trays with multiple flow passages therethrough, supporting recrystallized precursor thereon, in downflow operation. The data also show that a same type vaporizer comprising trays with multiple flow passages therethrough, on which precursor solid is supported, can achieve superior saturation of the dispensed gas mixture in downflow operation, as compared with upflow operation.

It will be recognized that any of the various components, features and arrangements described herein, and/or selected ones thereof, may be combined with one another as appropriate to construct vaporizers having application for delivery of vapor derived from a volatilizable precursor material, with all such combinations and permutations regarded as being within the contemplation of the present disclosure.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A vaporizer, comprising:
   a vessel defining an interior volume and containing in the interior volume an assembly of trays configured to support vaporizable solid source material and in spaced-apart relationship to one another;
   an inlet introducing carrier gas to an upper portion of the interior volume of the vessel, above the assembly of trays, for flow of the carrier gas downwardly in contact with the vaporizable solid source material supported by the trays, to form carrier gas/solid source vapor mixture in a lower portion of the interior volume; and
   a gas flow passage member flowing carrier gas/solid source vapor mixture from the lower portion of the interior volume of the vessel to an outlet of the vessel for discharge therefrom,
   wherein the assembly of trays comprises trays with flow passages for downward flow of the carrier gas therethrough, wherein the flow passages comprise arched slits in the trays.

2. The vaporizer of claim 1, further comprising a lid configured to mate with the vessel at an upper end of the vessel, wherein the gas flow passage member comprises a gas flow tube having an open lower end disposed in a lower portion of the vessel, and extending upwardly through the lid through an outlet opening therein.

3. The vaporizer of claim 2, comprising a solid source material supported by at least some of the trays in the assembly of trays.

4. The vaporizer of claim 3, wherein the solid source material is supported on an upper surface of said at least some trays.

5. The vaporizer of claim 1, as coupled with a carrier gas source configured to supply carrier gas at volumetric flow rate of at least 1 standard liter per minute.

6. A vaporizer, comprising:
   a vessel defining an interior volume and containing in the interior volume an assembly of trays configured to support vaporizable solid source material and in spaced-apart relationship to one another;
   an inlet introducing carrier gas to the interior volume of the vessel for flow of the carrier gas through the interior volume in contact with the vaporizable solid source material supported by the trays, to form carrier gas/solid source vapor mixture;
   an outlet discharging from the vessel a carrier gas/solid source vapor mixture formed by contacting of the carrier gas with the vaporizable solid source material supported by the trays; and
   the assembly of trays comprising trays with flow passages for flow of the carrier gas therethrough, wherein the flow passages comprise arched slits in the trays.

7. The vaporizer of claim 6, comprising a solid source material supported by at least some of the trays in the assembly of trays.

8. The vaporizer of claim 7, wherein the solid source material is supported on an upper surface of said at least some trays.

9. A vaporizer, comprising:
- a vessel defining an interior volume and containing in the interior volume an assembly of trays having sidewalls and configured to support vaporizable solid source material and in spaced-apart relationship to one another;
- an inlet adapted to introduce carrier gas to the interior volume of the vessel for flow of the carrier gas through the interior volume in contact with the vaporizable solid source material supported by the trays, to form carrier gas/solid source vapor mixture;
- an outlet for discharging from the vessel a carrier gas/solid source vapor mixture formed by contacting of the carrier gas with the vaporizable solid source material supported by the trays; and
- an array of individual support rings in the interior volume of the vessel, wherein each individual support ring is positioned to support thereon one tray of said assembly of trays, in alternating sequence of support rings and trays to form a stacked array of alternating support rings and trays;
- wherein the assembly of trays comprises trays with flow passages for downward flow of the carrier gas therethrough, wherein the flow passages comprise arched slits in the trays.

10. The vaporizer of claim 9, wherein the support rings are configured to support a peripheral portion of the tray supported thereon.

11. The vaporizer of claim 10, wherein the support rings are configured to be in contact with interior volume surface of the vessel.

12. The vaporizer of claim 9, wherein the support rings are formed of a material of construction comprising metal.

13. A method of fabricating a vaporizer configured for flow of carrier gas through an interior volume of a vaporizer vessel for contact with vaporizable solid source material supported on trays in the vaporizer vessel to form a carrier gas/vaporized solid source gas mixture for discharge from the vaporizer, said method comprising providing multiple trays having sidewalls and individual support rings, and alternatingly installing the support rings and successive ones of the multiple trays in the interior volume of the vaporizer vessel, to form a stacked array of alternating support rings and trays, wherein each support ring is positioned to support thereon one of the multiple trays, wherein the trays comprise flow passages for passage of the carrier gas therethrough, wherein the flow passages comprise arched slits in the trays.

14. The method of claim 13, wherein the trays prior to installation in the interior volume of the vaporizer vessel have been loaded with vaporizable solid source material.

15. The method of claim 13, wherein the arched slits are openings arranged to disperse carrier gas in the interior volume of the vessel.

* * * * *